United States Patent
Liu et al.

(10) Patent No.: US 10,665,822 B2
(45) Date of Patent: May 26, 2020

(54) DISPLAY SCREEN AND MANUFACTURING METHOD THEREOF AND DISPLAY DEVICE

(71) Applicant: BOE TECHNOLOGY GROUP CO., LTD., Beijing (CN)

(72) Inventors: Guanghui Liu, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 115 days.

(21) Appl. No.: 15/751,706

(22) PCT Filed: Aug. 11, 2017

(86) PCT No.: PCT/CN2017/097092
§ 371 (c)(1),
(2) Date: Feb. 9, 2018

(87) PCT Pub. No.: WO2018/153036
PCT Pub. Date: Aug. 30, 2018

(65) Prior Publication Data
US 2019/0267575 A1    Aug. 29, 2019

(30) Foreign Application Priority Data
Feb. 22, 2017  (CN) .................... 2017 2 0161418 U

(51) Int. Cl.
H01L 51/52 (2006.01)
H01L 27/32 (2006.01)
H01L 29/786 (2006.01)

(52) U.S. Cl.
CPC .......... *H01L 51/5284* (2013.01); *H01L 27/32* (2013.01); *H01L 29/7869* (2013.01); *H01L 51/52* (2013.01); *H01L 51/5206* (2013.01); *H01L 51/5234* (2013.01); *H01L 51/5268* (2013.01); *H01L 51/5271* (2013.01)

(58) Field of Classification Search
CPC .................... H01L 29/66007; H01L 29/66409
See application file for complete search history.

(56) References Cited

U.S. PATENT DOCUMENTS

| | | | |
|---|---|---|---|
| 2012/0138937 A1* | 6/2012 | Jo | ........................ H01L 27/1218 257/59 |
| 2013/0271690 A1* | 10/2013 | Matsukizono | ...... H01L 27/1225 349/46 |
| 2016/0380239 A1 | 12/2016 | Xu | |
| 2017/0062772 A1 | 3/2017 | Chu et al. | |

FOREIGN PATENT DOCUMENTS

| | | |
|---|---|---|
| CN | 104952791 A | 9/2015 |
| CN | 105070741 A | 11/2015 |

OTHER PUBLICATIONS

International Search Report dated Nov. 30, 2017.

* cited by examiner

Primary Examiner — Cheung Lee
(74) Attorney, Agent, or Firm — Dilworth & Barrese, LLP.; Michael J. Musella, Esq.

(57) ABSTRACT

A display screen, a manufacturing method thereof, and a display device are disclosed. The display screen includes a base substrate, a thin film transistor located on the base substrate, the thin film transistor including a metal layer, at least one of a light-absorbing material layer or a scattering structure disposed between the base substrate and the metal layer in a direction perpendicular to the base substrate.

20 Claims, 3 Drawing Sheets

DISPLAY SCREEN AND MANUFACTURING METHOD THEREOF AND DISPLAY DEVICE

The application claims priority to the Chinese patent application No. 201720161418.X, filed Feb. 22, 2017, the entire disclosure of which is incorporated herein by reference as part of the present application.

TECHNICAL FIELD

Embodiments of the present disclosure relate to a display screen and a display device.

BACKGROUND

Organic light-emitting diode (OLED) products are the developing trend of the future display, have advantages such as high color gamut, and high contrast etc., have attracted many agencies and manufacturers to develop and produce. The mainstream OLEDs are divided into a bottom-emission mode and a top-emission mode according to emission direction of the light-emitting layer (EL).

SUMMARY

Embodiments of the present disclosure provide a display screen including a base substrate, a thin film transistor located on the base substrate, the thin film transistor including a metal layer, and at least one of a light-absorbing material layer or a scattering structure, located between the base substrate and the metal layer in a direction perpendicular to the base substrate.

In an example, light-absorbing ability of the light-absorbing material layer is greater than that of the metal layer.

In an example, the at least one of the light-absorbing material layer or the scattering structure is in direct contact with the metal layer.

In an example, the light-absorbing material layer and the scattering structure are disposed separately, and in a direction perpendicular to the base substrate, the scattering structure is located between the metal layer and the light-absorbing material layer.

In an example, a part of a surface of the base substrate facing the thin film transistor is served as the scattering structure.

In an example, at least a part of a surface of the metal layer facing the base substrate is served as the scattering structure.

In an example, the light-absorbing material layer is in direct contact with the scattering structure.

In an example, an orthographic projection of the metal layer on the base substrate is within an orthographic projection of the at least one of the light-absorbing material layer or the scattering structure on the base substrate.

In an example, the metal layer comprises at least one selected from the group consisting of a gate electrode metal layer, a source electrode metal layer and a drain electrode metal layer.

Another embodiment of the present disclosure provides a display device, comprising at least one of the display screens described above.

Another embodiment of the present disclosure provides a manufacturing method of a display screen, comprising: providing a base substrate; forming a thin film transistor on the base substrate, the thin film transistor comprising a metal layer; and providing at least one of a light-absorbing material layer or a scattering structure, between the metal layer and the base substrate in a direction perpendicular to the base substrate.

In an example, the at least one of the light-absorbing material layer or the scattering structure is in direct contact with the metal layer.

In an example, the light-absorbing material layer and the scattering structure are disposed separately, and in a direction perpendicular to the base substrate, the scattering structure is located between the metal layer and the light-absorbing material layer.

In an example, providing at least one of the light-absorbing material layer or the scattering structure between the base substrate and the metal layer comprises: treating a portion of a surface of the base substrate facing the thin film transistor so as to be served as the scattering structure.

In an example, providing at least one of the light-absorbing material layer or the scattering structure between the metal layer and the base substrate comprises: treating at least a portion of a surface of the metal layer facing the base substrate so as to be served as the scattering structure.

In an example, the light-absorbing material layer is in direct contact with the scattering structure.

In an example, an orthographic projection of the metal layer on the base substrate is within an orthographic projection of the at least one of the light-absorbing material layer or the scattering structure on the base substrate.

In an example, the metal layer comprises at least one selected from the group consisting of a gate electrode metal layer, a source electrode metal layer and a drain electrode metal layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure. It is to be noted that, in case of no conflict, different features in one embodiment or features in different embodiments can be combined.

Figure 1:
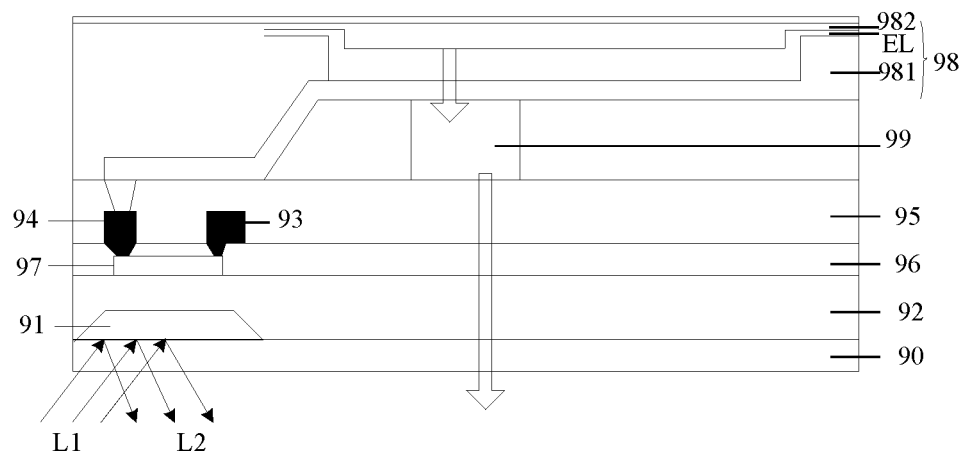
FIG. 1 is a schematic cross-sectional view illustrating a structure of a display screen.

FIG. 1 is a schematic view illustrating a structure of a display screen. As illustrated in FIG. 1, an array substrate of the display screen includes a base substrate 90, a gate electrode metal layer 91, a gate insulation layer 92, a source electrode 93, a drain electrode 94, a passivation layer 95, an etch stop layer 96, an active layer 97, an electroluminescent device 98, the electroluminescent device 98 can include an anode 981, a light-emitting layer EL, and a cathode 982. For a bottom-emission mode, light emitted from the EL emits out from the array substrate side (referring to a hollow arrow in FIG. 1). When an observer views the display screen from the array substrate side, because the metal layer 91 is prepared on the array substrate, ambient light L1 is reflected on the metal layer 91 to produce adverse reflection light L2, which affects the observer viewing the display screen.

For example, the reflection light of the metal layer on the array substrate side can be eliminated by attaching a polarizer having a ¼ shifting for circular polarized light. However, the method of using the polarizer to solve the problems of reflection light of the metal layer has high requirements on the raw materials and the attachment process, which will affect the yield and the performance of the OLED. In addition, the polarizer has a problem of high cost and is not conducive to application and promotion.

Figure 2:
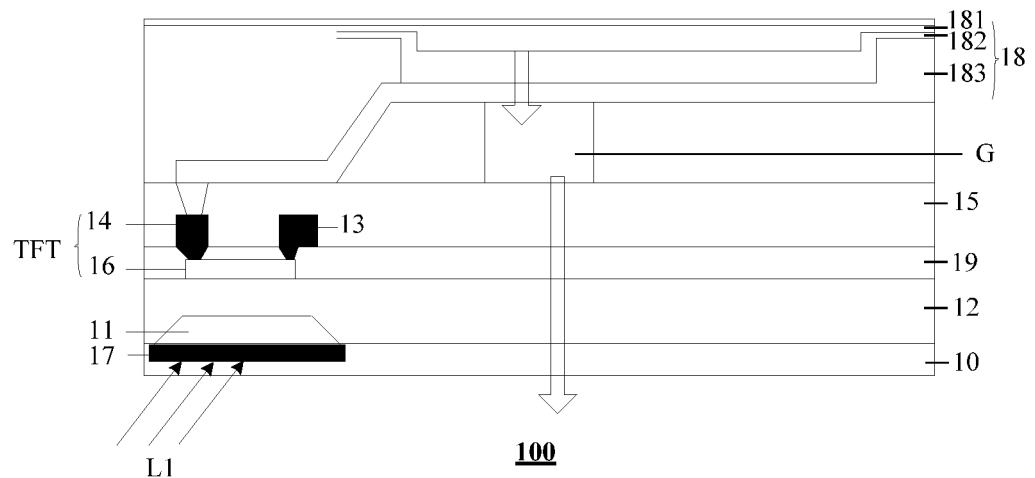
FIG. 2 is a schematic cross-sectional view illustrating a structure of a display screen according to an embodiment of the present disclosure.

FIG. 2 is a schematic view illustrating a structure of a part of a display screen according to the present disclosure. As illustrated in FIG. 2, the array substrate of the display screen 100 includes a base substrate 10, a gate electrode metal layer 11, a gate insulation layer 12, a source electrode 13, a drain electrode 14, a passivation layer 15, and an active layer 16.

The array substrate further includes a light-absorbing material layer 17 between the base substrate 10 and the gate electrode metal layer 11.

Herein, the light-absorbing ability of the light-absorbing material layer 17 is greater than that of the gate electrode metal layer 11.

In the embodiment of the present disclosure, the ambient light L1 incident on the metal layer 11 can be absorbed by the light-absorbing material layer 17 without an additional polarizer, which avoids the problems caused by the raw materials and the attachment process of the polarizer.

Optionally, in the embodiment of the present disclosure, the light-absorbing material layer 17 can be a black light-absorbing material.

For example, the light-absorbing material layer 17 is overlapped with the gate electrode metal layer 11 in a direction perpendicular to the base substrate 10. For example, an orthographic projection of the gate electrode metal layer 11 on an upper surface of the base substrate 10 is within an orthographic projection of the light-absorbing material layer 17 on the upper surface of the base substrate 10.

For example, the light-absorbing material layer 17 is in direct contact with the gate electrode metal layer 11. For example, the light-absorbing material layer 17 is in direct contact with the base substrate 10.

For example, a reflectivity of a side of the light-absorbing material layer 17 facing the base substrate 10 is less than a reflectivity of a side of the gate electrode metal layer 11 facing the base substrate 10.

It should be noted that, the black light-absorbing material is only an optional embodiment of the present disclosure, and other light-absorbing materials can be used in the present disclosure, for example, light-absorbing materials in other colors.

Figure 3:
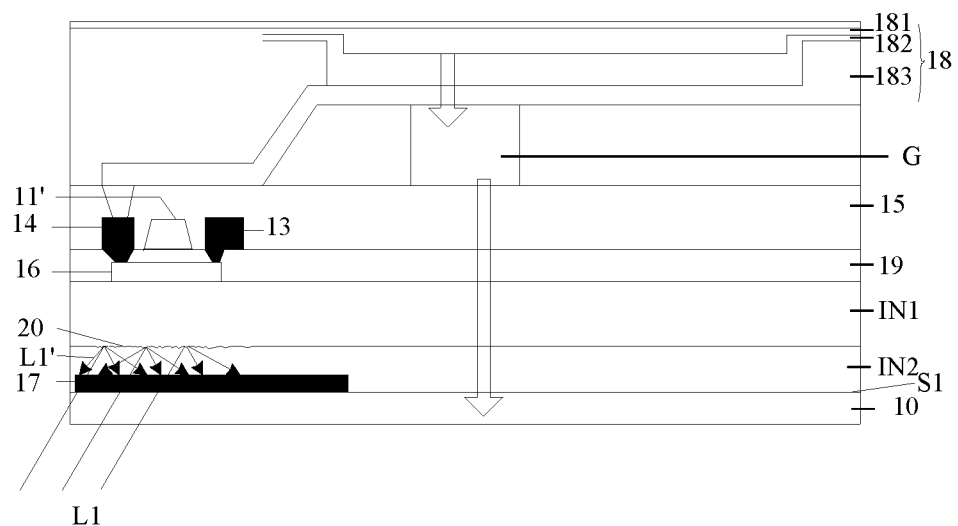
FIG. 3 is a schematic cross-sectional view illustrating a structure of a display screen according to an embodiment of the present disclosure.

In the display screen provided by another embodiment of the present disclosure, referring to FIG. 3, the light-absorbing material layer 17 is spaced apart from the gate electrode metal layer 11. The thin film transistor TFT has a top-gate structure. The display screen further includes a scattering structure 20. For example, in a direction perpendicular to the base substrate 10, the light-absorbing material layer 17 and the scattering structure 20 are located between the base substrate 10 and the gate electrode metal layer 11'. Interlayer insulation layers IN1 and IN2 are further disposed between the light-absorbing material layer 17 and the gate electrode metal layer 11. For example, the scattering structure 20 is provided at an interface of the interlayer insulation layers IN1 and IN2, and is configured to enable light incident on the scattering structure to be diffusely reflected. For example, the scattering structure 20 is obtained by treating an upper surface of the interlayer insulation layer IN2 into an uneven surface with protrusions and depressions. When the ambient light L1 is incident on the light-absorbing material layer 17, a first portion thereof the light is absorbed while a second portion thereof L1' is transmitted through the light-absorbing material layer 17, and the second portion of light L1' is scattered by the scattering structure and re-enters the light-absorbing material layer 17, and can be absorbed again.

For example, the source electrode layer 13 and the drain electrode layer 14 are also metal layers respectively.

In addition, even if a portion of the ambient light is incident on the gate electrode metal layer 11, the source electrode layer 13 and the drain electrode layer 14, the light-absorbing material layer 17 can absorb light reflected by the metal layers, so that the adverse reflection light of the metal layers can be reduced or eliminated.

In another example, a portion of a surface S1 of the base substrate 20 facing the thin film transistor is served as the scattering structure 20.

In yet another example, at least a portion of a surface of the gate electrode metal layer 11 or 11' facing the base substrate 10 is served as the scattering structure 20.

For example, the scattering structure 20 is directly formed on a surface of the light-absorbing material layer 17 facing the base substrate 10; and/or, the scattering structure 20 is formed directly on the surface of the light-absorbing material layer 17 facing the gate electrode metal layer 11, the source electrode layer 13 and the drain electrode layer 14. In this way, the scattering structure 20 is in direct contact with the light-absorbing material layer 17.

Figure 4:
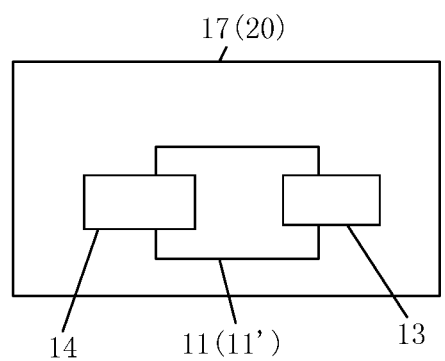
FIG. 4 is a schematic plan view of a part of a structure of a display screen according to an embodiment of the present disclosure.
Figure 5:
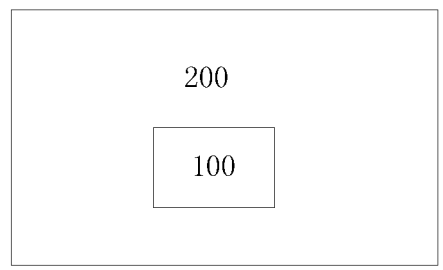
FIG. 5 is a block diagram of a display device according to an embodiment of the present disclosure.

Further, referring to FIG. 4, in a plan view, orthographic projections of the gate electrode metal layer 11, the source electrode layer 13 and the drain electrode layer 14 on the base substrate 10 lie within orthographic projections of the light-absorbing material layer 17 and the scattering structure 20 on the base substrate 10. For example, an orthographic projection of the light-absorbing material layer 17 on the base substrate 10 coincides with an orthographic projection of the scattering structure 20 on the base substrate 10.

For example, in another example, an orthographic projection of the gate electrode metal layer 11 on the base substrate 10 coincides with an orthographic projection of the light-absorbing material layer 17 on the base substrate 10.

Optionally, in the embodiment of the present disclosure, the light-absorbing material layer 17 is formed of, for example, one of the following materials: silicon carbide, black zirconia, and black organic material.

It should be noted that, the silicon carbide, the black zirconia, the black organic material and the like of the examples of present disclosure are merely optional embodiments of the present disclosure. The black organic material can be any black material capable of absorbing light.

For example, the display screen in the above embodiment includes both the scattering structure 20 and the light-absorbing material layer 17. However, it is understood that, the display screen provided in other embodiments may only include the scattering structure 20 but not include the light-absorbing material layer 17. Due to the scattering structure, the problem of adverse reflection light caused by the metal layer in the array substrate can be reduced or eliminated.

Optionally, the display screen according to an embodiment of the present disclosure is a liquid crystal display screen or an organic light-emitting diode (OLED) screen.

Optionally, the display screen in the embodiment of the present disclosure is an OLED display screen.

The array substrate further includes an electroluminescent device 18. A hollow arrow in FIG. 2 illustrates a light exit direction of the display screen. It can be seen from FIG. 2 that the light-absorbing material layer 17 is located downstream the gate electrode metal layer 11 in the light exit direction of the display screen.

Optionally, an etch stop layer 19 is further disposed between the passivation layer and the active layer of the display screen of the present disclosure.

Optionally, the display is an OLED display.

A color filter layer G is disposed between the electroluminescent device 18 and the passivation layer 15. The electroluminescent device 18 of the embodiment of the present disclosure can include a cathode 181, a light-emitting layer 182 and an anode 183. In addition, the color filter layer G can be disposed between the anode 183 and the passivation layer 15.

Optionally, the light-absorbing material layer of the present disclosure covers on the gate electrode metal layer in one of the following manners:

sputtering, chemical vapor deposition, spin coating and linear coating.

It should be noted that, sputtering, chemical vapor deposition, spin coating and linear coating are merely optional manners of the present disclosure. The present disclosure can also use other manners to provide the light-absorbing material between the base substrate and the gate electrode metal layer, for example, vacuum evaporation, printing, etc., the manners can be determined according to the properties of light-absorbing materials and process requirements.

Optionally, the light-absorbing material layer of the present disclosure can be disposed between the base substrate and the gate electrode metal layer in such a manner as to completely cover the display side of the gate electrode metal layer.

In an embodiment of the present disclosure, an array substrate of a display screen includes a base substrate, a gate electrode metal layer, a gate insulation layer, a source electrode, a drain electrode, a passivation layer, and an active layer. The array substrate further includes: a light-absorbing material layer disposed at the metal layer. By providing the light-absorbing material layer on a side of the gate electrode metal layer 11 facing the base substrate 10, the process difficulty of dealing with the problem of light reflection of the array substrate is reduced.

In addition, a light-absorbing material is employed by the present disclosure to absorb reflection light of the metal layer, the process difficulty is small, and the corresponding material can be selected according to the cost, which is favorable for the production of the product.

The present disclosure can also provide a method for manufacturing the above display screen based on the structure of the display screen described above. The light-absorbing material layer can be disposed between the base substrate and the gate electrode metal layer with reference to the processes of a related art. For example, an orthographic projection of the gate electrode metal layer 11 on an upper surface of the base substrate 10 completely coincides with an orthographic projection of the light-absorbing material layer 17 on the upper surface of the base substrate 10.

The present disclosure further provides a display device 200. Referring to FIGS. 2 to 5, a display screen 100 of a display device 200 includes an array substrate including a base substrate, a gate electrode metal layer, a gate insulation layer, a source electrode, a drain electrode, a source electrode layer, a drain electrode, a passivation layer and an active layer. The array substrate further includes:

a light-absorbing material layer disposed between the base substrate and the gate electrode metal layer.

In the present disclosure, the reflection light of the metal layer can be absorbed by the light-absorbing material layer, no additional polarizer is needed, and problems caused by the raw materials and the attachment process of the polarizer are avoided.

Optionally, the light-absorbing material layer of the present disclosure completely covers a display side of the gate electrode metal layer.

Optionally, the display screen according to the embodiment of the present disclosure is:

a liquid crystal display or an organic light-emitting diode (OLED) display.

Optionally, in the embodiment of the present disclosure, in a case that the display screen is an OLED display screen, the array substrate further includes an electroluminescent device. The electroluminescent device according to an embodiment of the present disclosure can include an anode, a cathode, and a light-emitting layer between the anode and the cathode.

Optionally, an etch stop layer is further disposed between the passivation layer and the active layer of the display screen of the present disclosure.

Optionally, in a case that the display screen in an embodiment of the present disclosure is an OLED display screen;

the array substrate further includes an electroluminescent device.

Optionally, the display screen in the embodiment of the present disclosure is an OLED display screen;

a color filter layer is disposed between the electroluminescent device and the passivation layer.

Optionally, the light-absorbing material layer of the present disclosure is made of a black light-absorbing material.

It should be noted that, the black light-absorbing material is only an exemplary embodiment of the present disclosure, and other light-absorbing materials can be used in the present disclosure, for example, light-absorbing materials in other colors. For example, the light-absorbing material can absorb light reflected by the metal layer, and the light reflected by the metal layer is extinguished after absorption.

Optionally, the light-absorbing material layer of the present disclosure is formed of one of the following materials: silicon carbide, black zirconia, and black organic material.

It should be noted that, the silicon carbide, the black zirconia, the black organic material, and the like of the examples of present disclosure are merely optional embodiments of the present disclosure. The black organic material can be any black material with light absorbing performance.

Optionally, the light-absorbing material of the present disclosure covers on the gate electrode metal layer in one of the following ways:

sputtering, chemical vapor deposition, spin coating, and linear coating.

It should be noted that sputtering, chemical vapor deposition, spin coating and linear coating are merely optional embodiments of the present disclosure. The present disclosure can also use other manners to provide the light-absorbing material between the base substrate and the gate electrode metal layer, for example, vacuum deposition, printing, etc., the manners can be determined according to the properties and process requirements of the light-absorbing material.

In an embodiment of the present disclosure, an array substrate of a display screen includes a base substrate, a gate electrode metal layer, a gate insulation layer, a source electrode, a drain electrode, a passivation layer, and an active layer. The array substrate further includes: a light-absorbing material layer at the metal layer. The light-absorbing material provided in the gate electrode metal layer of the present disclosure is employed to reduce the process difficulty of dealing with the problem of reflection light of the array substrate.

In addition, a light-absorbing material is employed by the present disclosure to absorb reflection light of the metal layer, the process difficulty is small, and a corresponding material can be selected according to the cost, which is favorable for the production of the product.

Figure 6:
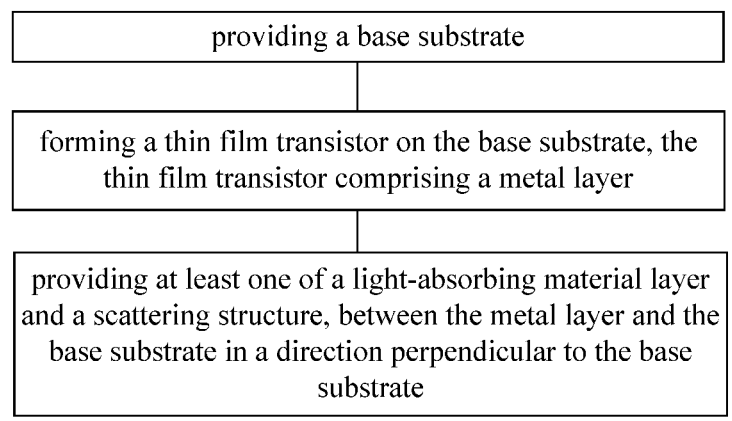
FIG. 6 is a schematic diagram of a manufacturing method of a display screen according to an embodiment of the present disclosure.

Another embodiment of the present disclosure provides a method for manufacturing a display screen. Referring to FIG. 6, the method includes:

providing a base substrate;

forming a thin film transistor on the base substrate, the thin film transistor including a metal layer; and providing at least one of a light-absorbing material layer or a scattering structure between the metal layer and the base substrate in a direction perpendicular to the base substrate.

Herein, the sequence of execution of the steps of the respective blocks in FIG. 6 is not limited.

For example, the at least one of the light-absorbing material layer or the scattering structure is in direct contact with the metal layer.

In one example, a portion of a surface of a base substrate configured to form a TFT is roughened to form an uneven surface with protrusions and depressions, so as to be served as a scattering structure.

In another example, at least a portion of a surface of the gate electrode metal layer facing the base substrate is roughened to form an uneven surface with protrusions and depressions, so as to be served as a scattering structure.

In yet another example, at least a portion of a surface of the light-absorbing layer facing the base substrate and/or at least a portion of the light-absorbing layer facing a surface of the metal layer, are/is roughened, to form an uneven surface with protrusions and depressions, so as to be served as a scattering structure. In this way, the light-absorbing material layer is in direct contact with the scattering structure.

For example, an orthographic projection of the metal layer on the base substrate is within an orthographic projection of the at least one of the light-absorbing material layer or the scattering structure on the base substrate.

For example, the metal layer includes at least one of a gate electrode metal layer, a source electrode metal layer, and a drain electrode metal layer.

Although the embodiments disclosed in the present disclosure are as described above, the content is just for the convenience of understanding the technical solutions of the present disclosure and is not intended to limit the disclosure. Any of those skilled in related arts to which the present disclosure pertains can make any modification or change in the form and details of the implementation without departing from the technical solutions disclosed in the present disclosure. However, the scope of protection limited by the disclosure should be defined in the appended claims.

The invention claimed is:

1. A display screen, comprising:
a base substrate,
a thin film transistor, located on the base substrate, comprising a metal layer; and
a light-absorbing material layer and a scattering structure, located between the base substrate and the metal layer in a direction perpendicular to the base substrate,
wherein in the direction perpendicular to the base substrate, the scattering structure is located between the metal layer and the light-absorbing material layer.

2. The display screen according to claim 1, wherein light-absorbing ability of the light-absorbing material layer is greater than that of the metal layer.

3. The display screen according to claim 2, wherein at least one of the light-absorbing material layer and the scattering structure is in direct contact with the metal layer.

4. The display screen according to claim 1, wherein the at least one of the light-absorbing material layer and the scattering structure is in direct contact with the metal layer.

5. The display screen according to claim 1, wherein a part of a surface of the base substrate facing the thin film transistor is served as the scattering structure.

6. The display screen according to claim 1, wherein at least a part of a surface of the metal layer facing the base substrate is served as the scattering structure.

7. The display screen according to claim 1, wherein the light-absorbing material layer is in direct contact with the scattering structure.

8. The display screen according to claim 1, wherein an orthographic projection of the metal layer on the base substrate is within an orthographic projection of at least one of the light-absorbing material layer and the scattering structure on the base substrate.

9. The display screen according to claim 1, wherein the metal layer comprises at least one selected from the group consisting of a gate electrode metal layer, a source electrode metal layer and a drain electrode metal layer.

10. The display screen according to claim 1, wherein the scattering structure and the light-absorbing material layer are sequentially disposed in a light exit direction of the display screen.

11. The display screen according to claim 1, further comprising a first interlayer insulation layer and a second interlayer insulation layer disposed between the light-absorbing material layer and the metal layer, and
wherein the scattering structure is provided at an interface of the first interlayer insulation layer and the second interlayer insulation layer.

12. A display device, comprising the display screen according to claim 1.

13. A manufacturing method of a display screen, comprising:
providing a base substrate;

forming a thin film transistor on the base substrate, the thin film transistor comprising a metal layer; and providing a light-absorbing material layer and a scattering structure, between the metal layer and the base substrate in a direction perpendicular to the base substrate, wherein in the direction perpendicular to the base substrate, the scattering structure is located between the metal layer and the light-absorbing material layer.

14. The manufacturing method of the display screen according to claim 13, wherein at least one of the light-absorbing material layer and the scattering structure is in direct contact with the metal layer.

15. The manufacturing method of the display screen according to claim 13, wherein providing the light-absorbing material layer and the scattering structure between the base substrate and the metal layer comprises:

treating a portion of a surface of the base substrate facing the thin film transistor so as to be served as the scattering structure.

16. The manufacturing method of the display screen according to claim 13, wherein providing the light-absorbing material layer and the scattering structure between the metal layer and the base substrate comprises:

treating at least a portion of a surface of the metal layer facing the base substrate so as to be served as the scattering structure.

17. The manufacturing method of the display screen according to claim 13, wherein the light-absorbing material layer is in direct contact with the scattering structure.

18. The manufacturing method of the display screen according to claim 13, wherein an orthographic projection of the metal layer on the base substrate is within an orthographic projection of at least one of the light-absorbing material layer and the scattering structure on the base substrate.

19. The manufacturing method of the display screen according to claim 13, wherein the metal layer comprises at least one selected from the group consisting of a gate electrode metal layer, a source electrode metal layer and a drain electrode metal layer.

20. The manufacturing method of the display screen according to claim 13, wherein the scattering structure and the light-absorbing material layer are sequentially disposed in a light exit direction of the display screen.

* * * * *